US007782020B1

(12) United States Patent
Gumtow

(10) Patent No.: US 7,782,020 B1
(45) Date of Patent: Aug. 24, 2010

(54) OPERATING A NON-VOLATILE MEMORY CHARGER

(75) Inventor: Eric Gumtow, Sunnyvale, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 0 days.

(21) Appl. No.: 11/035,638

(22) Filed: Jan. 14, 2005

(51) Int. Cl.
*H02J 7/16* (2006.01)

(52) U.S. Cl. ............... 320/149; 320/134; 320/137

(58) Field of Classification Search ........... 320/149, 320/134, 163, 48, 43, 162, 132, 137; 711/216, 711/322, 300, 24, 22; 713/300; 365/52
See application file for complete search history.

(56) References Cited

U.S. PATENT DOCUMENTS

| 4,743,831 | A | * | 5/1988 | Young ..................... 320/127 |
| 5,423,045 | A | * | 6/1995 | Kannan et al. ............. 713/322 |
| 5,459,671 | A | * | 10/1995 | Duley ........................ 702/63 |
| 5,506,572 | A | * | 4/1996 | Hills et al. ............. 340/636.15 |
| 5,565,759 | A | * | 10/1996 | Dunstan .................... 320/135 |
| 5,798,961 | A | * | 8/1998 | Heyden et al. .............. 365/52 |
| 5,831,412 | A | * | 11/1998 | Morioka et al. ............ 320/106 |
| 5,872,444 | A | * | 2/1999 | Nagano et al. ............. 320/106 |
| 5,994,878 | A | * | 11/1999 | Ostergaard et al. ......... 320/132 |
| 6,194,870 | B1 | * | 2/2001 | Kim ........................ 320/134 |
| 6,809,675 | B1 | * | 10/2004 | Bomhoff et al. ............ 341/155 |
| 7,024,571 | B1 | * | 4/2006 | Reger et al. ............... 713/323 |
| 7,111,183 | B1 | * | 9/2006 | Klein et al. ................ 713/330 |
| 7,114,658 | B2 | * | 10/2006 | Lima et al. ................. 235/492 |
| 7,139,937 | B1 | * | 11/2006 | Kilbourne et al. ........... 714/47 |
| 7,161,495 | B1 | | 1/2007 | Kilbourne, II et al. |
| 2002/0078399 | A1 | * | 6/2002 | Caulkins ................... 714/24 |
| 2003/0217300 | A1 | | 11/2003 | Fukumori et al. |
| 2005/0091229 | A1 | | 4/2005 | Bali et al. |
| 2005/0121979 | A1 | | 6/2005 | Matsumoto et al. |
| 2005/0253554 | A1 | * | 11/2005 | DiFazio et al. ............. 320/114 |

OTHER PUBLICATIONS

I²C Background, found at http://www.microport.tw/blognew.php?blog_no=7#theory, as downloaded on Apr. 16, 2009.

* cited by examiner

*Primary Examiner*—Bao Q Vu
*Assistant Examiner*—Nguyen Tran
(74) *Attorney, Agent, or Firm*—Blakely, Sokoloff, Taylor & Zafman LLP

(57) ABSTRACT

Provided is a method and system for operating a non-volatile memory charger. Specifically, during the operation of a storage system, the non-volatile memory of the storage system can temporarily store data. The temporarily stored data is flushed to disks of the storage system during the normal operation of the storage system. However, if the storage system is inoperable, then the temporarily stored data is maintained for a time period by a rechargeable battery of the non-volatile memory. The rechargeable battery prevents data loss when the temporarily stored data cannot be flushed to the disks of the storage system. The rechargeable battery maintains sufficient voltage levels to continue to temporarily store data by the operation of a charger connected to the rechargeable battery. A charger policy operated by an operating system of the storage system enables and disables the charging of the rechargeable battery.

17 Claims, 7 Drawing Sheets

OPERATING A NON-VOLATILE MEMORY CHARGER

CROSS REFERENCE TO RELATED APPLICATIONS

This application is related to application Ser. No. 10/836,845, entitled "Alert for Indicating Validity of Removable Memory Media" filed on Apr. 30, 2004, which is hereby incorporated by reference in its entirety.

TECHNICAL FIELD

Embodiments of the present invention relate to storage systems, and in particular, to non-volatile memory of storage systems.

BACKGROUND

During the operation of a storage system, data is typically stored on one or more disks of the storage system. One method by which data is stored on the disks is to initially temporarily store the data in a temporary storage location of the storage system. The temporary storage location permits high speed access to the data. Thereafter, during the operation of the storage system, the data stored in the temporary storage location is stored to the disks of the storage system. Typically, this temporary storage method is used when the disks have a slower access rate than the temporary storage location. Thus, by providing access to data quickly, the response time from data request to data delivery is short.

However, the storage system may experience downtime. For example, downtime can include situations when the storage system loses power, or perhaps, experiences a storage system failure, such as a storage system crash. Such failures result in the inability to store data to and deliver data from the storage system. Downtime can last for a few seconds or may last for longer periods of time, such as hours or days. During such downtime, data that was initially stored in the temporary storage location may not have been stored to the disks. Consequently, the data is lost. This situation may cause data inconsistencies because when the disks are accessed after the storage system recovers from the downtime, the data stored in the disks is older than the lost data stored in the temporary storage location.

In some storage systems where there is no data loss, a battery can be attached to the temporary storage location to enable the temporary storage location to continue to operate when the storage system experiences downtime. However, the downtime can last for long periods of time. During these long periods of time, the battery will discharge and the temporary storage location will once more lose data.

A solution to prevent data loss in the temporary storage location that has a discharged battery is to use a rechargeable battery to power the temporary storage location. However, although the rechargeable battery can be recharged, over time the rechargeable battery loses the ability to retain a charge. Ultimately, the storage system may operate with a temporary storage location that has a non-functioning or low performing rechargeable battery. Thus, when the storage system experiences downtime, the data stored in the temporary storage location will once more be lost.

Thus, what is needed is a method and a system to prevent losing data stored in the temporary storage location of the storage system while ensuring that the storage system does not operate with a temporary storage location that may not be able to retain data during downtime.

SUMMARY

Embodiments of the present invention provide a method and a system for operating a non-volatile memory charger of non-volatile memory. The non-volatile memory charger is capable of replenishing a battery of the non-volatile memory to prevent data loss and data inconsistencies of a storage system. It should be appreciated that the present invention can be implemented in numerous ways, such as a process, an apparatus, a system, a device or a method on a computer readable medium. Several inventive embodiments of the present invention are described below.

In an exemplary embodiment of a method of operating a non-volatile memory charger, the embodiment includes identifying multiple states for operating the non-volatile memory charger. Each state transitions to at least one other state in response to a voltage level of a battery. Further, the embodiment includes replenishing the battery by initiating the non-volatile memory charger to provide a charge to the battery. The battery is capable of operating a non-volatile memory. In addition, the embodiment includes providing a notification capable of identifying whether the battery is being charged or the battery needs replacement.

In an embodiment for a storage system for operating non-volatile memory, the storage system includes a charger that is connected to the non-volatile memory, such that the charger is capable of being operated by receiving a signal generated during multiple state transitions. The battery is connected to the charger, such that the battery is capable of retaining a minimum voltage level to operate the storage system by replenishment of the battery. Further, a memory is connected to the battery, such that the battery permits the temporary storage of data in the memory. The battery is associated with a warning indicating that the battery needs replacement.

In an embodiment of a system for operating a non-volatile memory charger, the embodiment includes means for identifying multiple states for operating the non-volatile memory charger. Further, the embodiment includes means for replenishing a battery, such that the battery is capable of operating a non-volatile memory. The embodiment also includes means for providing a notification capable of identifying whether the battery is being charged or the battery needs replacement.

In an embodiment of a computer readable medium for operating a non-volatile memory charger, the embodiment includes identifying multiple states for operating the non-volatile memory charger. Each state transitions to at least one other state in response to a voltage level of a battery. The embodiment also includes replenishing the battery by initiating the non-volatile memory charger to provide a charge to the battery. The battery is capable of operating a non-volatile memory. Further, the embodiment includes providing a notification capable of identifying whether the battery is being charged or the battery needs replacement.

Other aspects of the invention will become apparent from the following detailed description taken in conjunction with the accompanying drawings, which illustrates by way of example, the principles of the invention.

DETAILED DESCRIPTION

The following embodiments describe a method and a system for operating a non-volatile memory charger of non-volatile memory. The non-volatile memory charger is capable of replenishing a battery of the non-volatile memory to prevent data loss and data inconsistencies of a storage system. It will be obvious, however, to one skilled in the art, that embodiments of the present invention may be practiced without some or all of these specific details. In other instances, well known process operations have not been described in detail in order not to unnecessarily obscure the embodiments of the present invention described herein.

Figure 1:
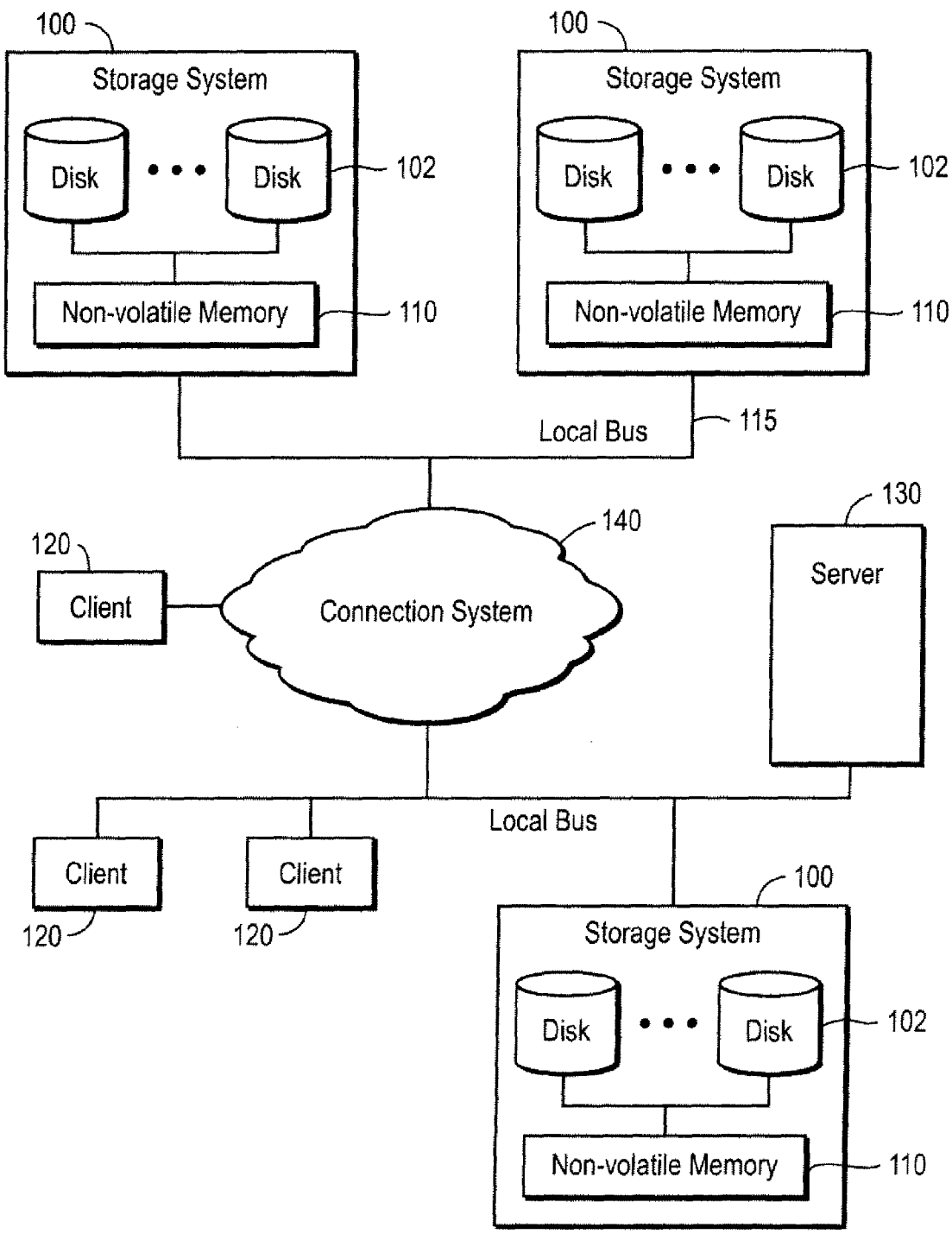
FIG. 1 is a diagram illustrating a network of storage systems, in accordance with an embodiment of the invention.

FIG. 1 is a diagram illustrating a network of storage systems, in accordance with an embodiment of the invention. The network of storage systems includes at least one storage system 100 connected to other systems of the network via a local bus 115 or a connection system 140. For example, other systems, such as a client 120 and a server 130, can store data on the storage system 100 by using the network. The storage system 100, client 120, and server 130 are computers that are capable of transmitting and receiving data for processing. For example, the storage system 100 receives data for storage. The received data is temporarily stored in a non-volatile memory 110 before storage of the data to one or more disks 102. Subsequently, requests for the stored data from clients 120, servers 130, and other storage systems 100 can be satisfied by transmitting the data onto the network. Embodiments of the present invention include storage systems 100 sold by Network Appliance, Inc. of Sunnyvale, Calif., sometimes referred to as storage appliances. Storage systems 100 and storage appliances are interchangeable terms that describe a computer capable of storing and processing data.

The local bus 115 includes local area networks that provide access to data stored on the storage system 100 in a geographically limited area, such as a building, or a group of buildings in a city. The connection system 140 includes non-geographically limited networks that provide access to the data stored on the storage system 100, such as the Internet. It should be appreciated that the local bus 115 and the connection system 140 can be wire-based or wireless, as long as data stored on the storage system 100 is accessible through the local bus 115 and the connection system 140.

Figure 2:
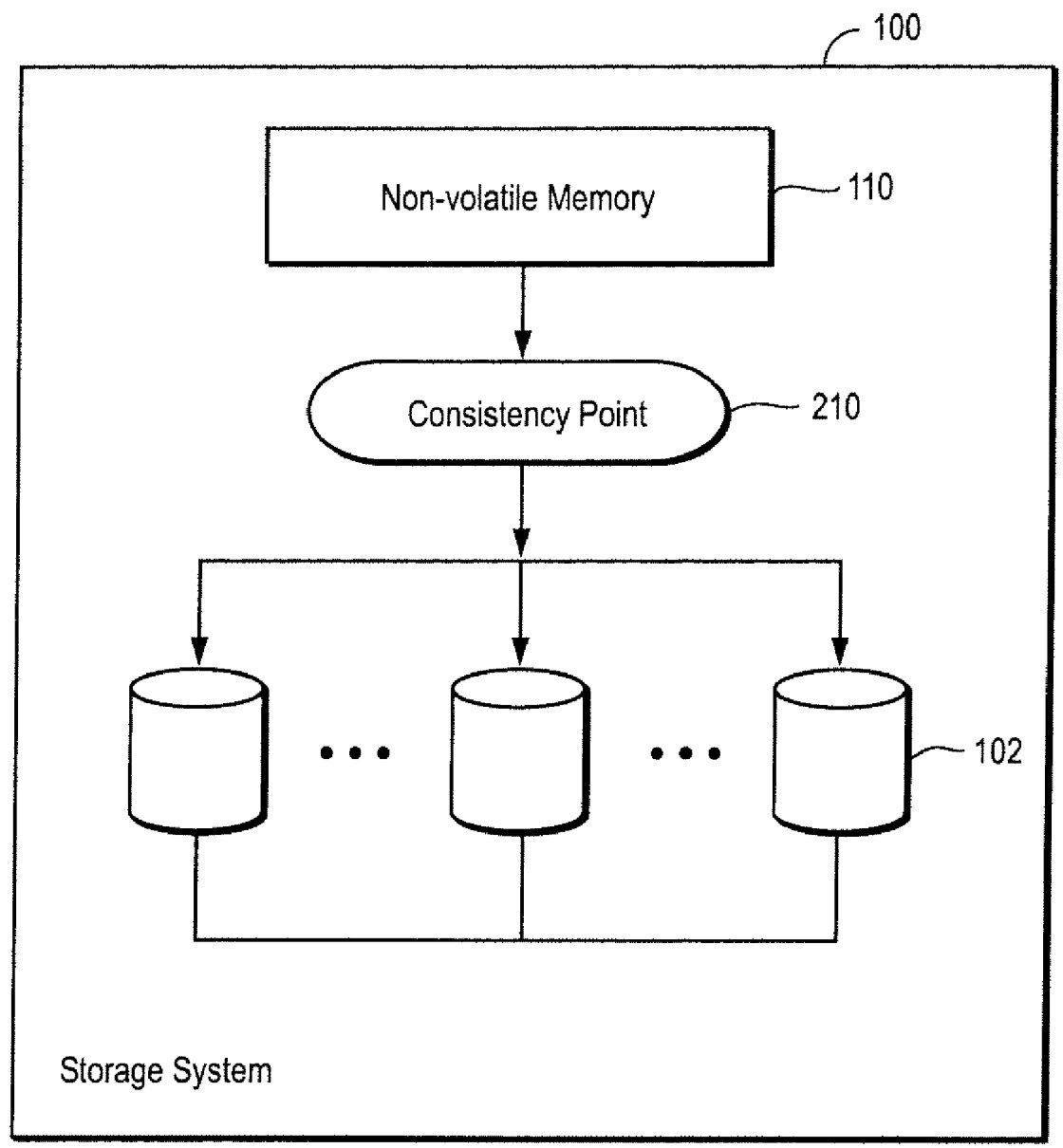
FIG. 2 is a diagram illustrating a storage system, in accordance with an embodiment of the invention.

FIG. 2 is a diagram illustrating the storage system 100, in accordance with an embodiment of the invention. The storage system 100 is similar to general purpose computers that include components such as processors (not shown), random access memories (not shown), caches (not shown), and disks 102. Moreover, the storage system 100 also includes the non-volatile memory 110, which temporarily stores data. Temporarily stored data in the non-volatile memory 110 may persist for seconds or days. An exemplary embodiment of the non-volatile memory 110 is a non-volatile memory random access memory (NVRAM) card coupled to the motherboard of the storage system 100. Data transmitted to the storage system 100 is propagated to the NVRAM card, which then propagates the data and meta-data, which is information about the data, to the disks 102 during each consistency point 210 (CP). The consistency point 210 is a point in time when data and meta-data stored in the NVRAM card is flushed, or stored, to the disks 102. Intervals between consistency points 210 can last approximately 5 seconds or less. For example, if the storage system 100 is not receiving or transmitting data, such as when the storage system 100 is idle, then data and meta-data can be flushed to the disks 102. Of course, longer intervals than 5 seconds are possible if the storage system 100 is busy processing data.

Typically, if the storage system 100 loses power and is inoperable, the non-volatile memory 110 maintains the most recent data transmitted to the storage system 100. Thus, when the storage system 100 regains power and begins to operate, the data temporarily stored in the non-volatile memory 110 is accessible. In one embodiment, having access to temporarily stored data permits the flushing of the data from the non-volatile memory 110 to the disks 102. In other embodiments, the non-volatile memory 110 may be removed and coupled to another motherboard of another storage system 100 to flush the data. For example, the physical removal of the non-volatile memory 110 may be necessary because the original storage system 100 that lost power is permanently inoperable.

During time periods when the storage system 100 is inoperable and data is temporarily stored on the non-volatile memory 110, embodiments of the present invention prevent data loss by ensuring the non-volatile memory 110 is capable of continuing to store the data. Specifically, a rechargeable battery of the non-volatile memory 110 can maintain a minimum voltage level, thereby permitting the continued storage of data on the non-volatile memory 110. Further, the minimum voltage level of the rechargeable battery can be analyzed to determine if the non-volatile memory 110 is capable of having enough power to flush data to the disks 102 after starting, also known as booting, the storage system 100.

In an exemplary embodiment of the present invention, computer code stored on memory of the non-volatile memory 110 is executed by an operating system of the storage system 100. The executed computer code produces instructions that operate a charger of the non-volatile memory 110, thereby permitting the recharging of the rechargeable battery. Specifically, FIG. 3 illustrates the components of the non-volatile memory 110, which enables the operation of the non-volatile memory charger.

Figure 3:
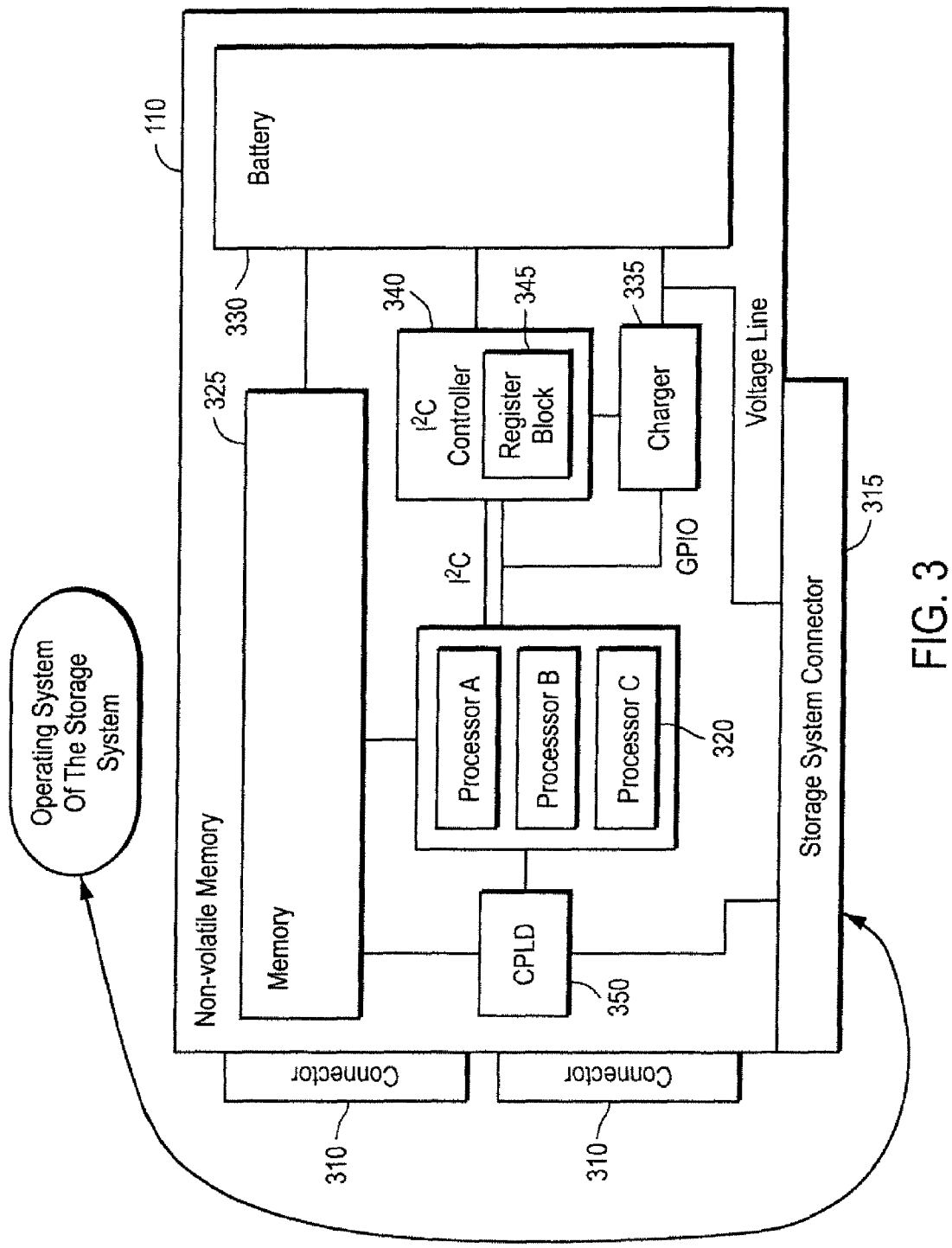
FIG. 3 is a diagram illustrating non-volatile memory, in accordance with an embodiment of the invention.

FIG. 3 is a diagram illustrating the non-volatile memory 110, in accordance with an embodiment of the invention. In one exemplary embodiment, the non-volatile memory 110 includes at least connector 310 and a storage system connector 315. The connector 310 can be an Infiniband™ connector well known to those of ordinary skill in the art. However, any type of connector 310 is possible, such as connectors capable of operating with Fibre Channel (FC) and Ethernet media that enable protocols such as Small Computer Systems Interface (SCSI) over FC and TCP/IP/Ethernet (iSCSI), as long as the connector 310 enables communication between one storage system 100 and another storage system 100. Thus, in an exemplary embodiment comprising a networked cluster of storage systems 100, data stored in one non-volatile memory 110 is accessible to other storage systems 100 of the networked cluster. In yet another exemplary embodiment, the connector 310 permits communication between storage systems 100 of a compute farm. For example, such a compute farm can consist of multiple computers providing access to data or computers capable of storing data.

The storage system connector 315, such as a Peripheral Component Interconnect Extended (PCI-X) bridge, connects the non-volatile memory 110 to a motherboard (not shown) of the storage system 100, thereby permitting signals to propagate from the motherboard to the non-volatile memory 110. Specifically, an operating system of the storage system 100 issues commands, such as "store data temporarily stored in the non-volatile memory to the disks," via signals propagated through the storage system connector 315.

Further, the non-volatile memory 110 includes components such as at least one processor 320, a memory 325, a battery 330, a charger 335, an inter-IC ($I^2C$) controller 340, and a complex programmable logic device (CPLD) 350. The $I^2C$ controller 340 also includes a register block 345 that stores instructions and data for operating the non-volatile memory 110. Connections such as an inter-IC ($I^2C$) line, a general purpose I/O (GPIO) line, and a voltage line enable signals to propagate from one component to another. The $I^2C$ line permits the communication of instructions and data between the processor 320 and the $I^2C$ controller 340. The GPIO line enables the processor 320 to control the operation of the charger 335 and the voltage line supplies power to the battery 330. Specifically, the voltage line supplies power to the battery 330 via the storage system connector 315. One of ordinary skill will appreciate that any number and type of connections are possible to connect the components of the non-volatile memory 110. For example, any suitable method of connecting the voltage line from a power source to charge the battery 330 is possible.

In an exemplary embodiment, the $I^2C$ controller 340 includes environmental sensors (not shown) that detect voltage levels. Voltage levels of the battery 330 and the charger 335 and stored in the register block 345. The voltage levels stored in the register block 345 are analyzed to determine whether to turn the charger 335 on and off. Specifically, the GPIO line to a pin (not shown) of the charger turns the charger 335 on and off. In other embodiments, the voltage levels can be stored in other registers (not shown) coupled to the battery 330 and the charger 335. Thus, one of ordinary skill will recognize that any suitable method of detecting and storing voltage levels is possible to enable the operation of the charger 335.

In an exemplary embodiment, multiple processors 320 can include processor A, processor B, and processor C. The processors 320 enable the processing of commands issued by the operating system of the storage system. An exemplary operating system of the storage system 100 is Data ONTAP™, sold by Network Appliance, Inc. Further, the storage system 100 can be a combined Network Attached Storage (NAS)/Storage Area Network (SAN) device. Other embodiments of the storage system 100 also include NAS-only and SAN-only devices. It should be appreciated that any device having an operating system capable of providing file-level access or block-based access to files stored on disks of the storage system 100 is possible.

The operating system of the storage system 100 includes a file system, such as Write Anywhere File Layout (WAFL®), also sold by Network Appliance, Inc. WAFL® enables the reliable storage of data on disks of the storage system 100. Such an exemplary file system is capable of receiving data via different communication protocols such as Network File System (NFS), Common Internet File System (CIFS), and HyperText Transfer Protocol (HTTP) and storing the received data to any area of the disks of the storage system. It should be appreciated that any operating system of the storage system 100 that receives data for storage is possible without departing from the exemplary embodiments of the invention.

In an exemplary embodiment, the operating system of the storage system 100 includes a method of operating the non-volatile memory charger. Data is stored in the memory 325, such as Random Access Memory (RAM) and flash memory (not shown). Specifically, in one embodiment, the RAM stores data and the flash memory stores computer code executed by the operating system, to operate the non-volatile memory charger. Further, the memory 325 can be any size. For example, the memory can be 512 MB or up to 8 GB. However, it should be appreciated that the memory can be any size, as long as the memory 325 is capable of temporarily storing data in the non-volatile memory 110.

The battery 330 is connected to the memory 325. Specifically, the battery 330 supplies the minimum voltage level to the non-volatile memory 110 to temporarily store the data in the memory 330. The minimum voltage level permits the data to reside in the memory 325 even when the storage system 100 is inoperable. Further, the minimum voltage level can also indicate the minimum amount of voltage to operate the storage system 100. Specific details regarding the minimum voltage level will be described in FIG. 4.

The battery 330, such as a lithium ion battery or the like, is a rechargeable battery. However, the battery 330 discharges over time. Thus, the charger 335 recharges the battery 330 multiple times to enable the battery 330 to operate the non-volatile memory 110. Generally, the battery 330 should be fully charged to operate the non-volatile memory 110 when the storage system 100 is inoperable. For example, a fully charged battery 330 can have a voltage level of approximately 4400 to 4100 millivolts (mV). An overcharged battery 330 can have a voltage level of approximately over 4400 mV. The CPLD 350 helps the operating system to maintain temporarily stored data in the non-volatile memory 110. For example, the CPLD 350 detects when the storage system 100 is inoperable because of a loss of power via the storage system connector 315. Further, the CPLD 350 also detects when the battery 330 no longer supplies the minimum voltage level to operate the non-volatile memory 110. Correspondingly, the CPLD 350 also detects when the battery 330 is overcharged.

Figure 4:
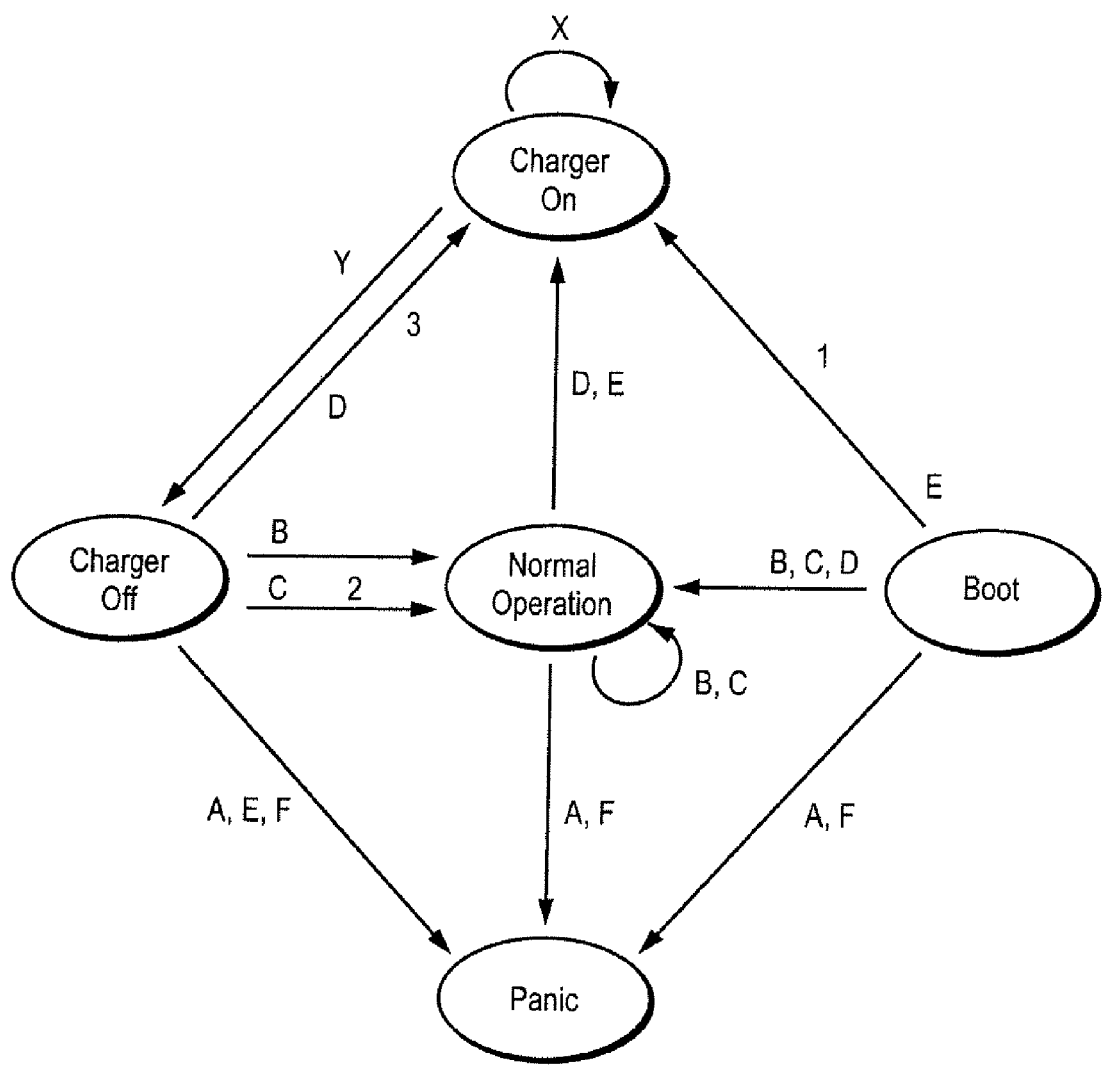
FIG. 4 is a diagram illustrating processes for operating the non-volatile memory, in accordance with an embodiment of the invention.

In accordance with an embodiment of the invention, FIG. 4 is a diagram illustrating processes for operating the non-volatile memory 110. In an exemplary embodiment, Table 1 indicates voltage levels that enable the operation of the charger 335.

TABLE 1

| A [overcharged]: | $V_{battery} > 4400$ (in millivolts) |
| B [fully charged]: | $4400 \geq V_{battery} > 4100$ |
| C [sufficiently charged]: | $4100 \geq V_{battery} > 4000$ |
| D [partially discharged]: | $4000 \geq V_{battery} > 3900$ |
| E [fully discharged]: | $3900 \geq V_{battery} > 1450$ |
| F [dead]: | $V_{battery} \leq 1450$ |
| X [active]: | $V_{charger} \leq 3000$ |
| Y [inactive]: | $V_{charger} \leq 3000$ |

1: warning that the battery voltage level is low and delay boot
2: warning that the battery may need replacement soon
3: warn that the battery needs replacement now Exemplary states, as illustrated in FIG. 4, transition to other states depending on the voltage level of the battery 330 or the voltage level of the charger 335. Transitions may or may not involve human interaction via a command line interface (CLI) of the operating system of the storage system 100. For example, the operating system of the storage system 100, without human interaction, can initiate a transition. When the storage system 100 starts during the boot state, the storage system 100 enters the panic state when the voltage level of the battery 330 is overcharged or dead. Specifically, the panic state indicates the battery 330 has been connected improperly or the battery 330 is of a different type that is incompatible with the proper operation of the non-volatile memory 110. Alternatively, during the boot state, when the voltage level of the battery 330 is full charged, sufficiently charged, or partially discharged, the storage system 100 enters the normal operation state. During the normal operation state, the battery 330 has the minimum voltage level to temporarily store data in the memory 325 of the non-volatile memory 110 for approximately three days or more. If the voltage level of the battery 330 is partially discharged or fully discharged, then the charger 335 is turned on and enters the charger on state. While the battery 330 is fully charged and sufficiently charged, the storage system 100 operates normally. Alternatively, if the voltage level of the battery 330 is overcharged or dead, then the panic state results.

Similar to transitioning to the charger on state from the normal operation state, the boot state can also transition to the charger on state. Specifically, when the battery 330 is fully discharged, a warning indicates that the battery voltage level is low and delays boot of the storage system 100 while the battery 330 recharges. Thus, when entering the charger on state or the normal operation state, the voltage level of the battery indicates the minimum voltage level to temporarily store data in the non-volatile memory 110 for approximately three days or more.

During the charger on state, the voltage level of the battery 330 is not monitored. Instead the voltage level of the charger 335 is monitored. The transition from the charger on state to the charger off state occurs when voltage level exceeds approximately 3000 mV. During charging the battery 330, if the battery 330 is fully charged or sufficiently charged, then a warning indicates that the battery 330 may need replacement soon and a transition to the normal operation state occurs. Alternatively, if the battery 330 is partially discharged, then a warning indicates that the battery 330 needs replacement now and a transition to the charger on state occurs. However, if the battery 330 is overcharged, fully discharged, or dead, then the panic state occurs.

During the operation of the charger 335, the operating system of the storage system 100 issues commands that monitor the voltage levels of the battery 330 and the charger 335. The processor 320 transmits instructions to store voltage levels on the register block 345 of the I²C controller 340. The stored voltage levels are compared with the voltage levels of Table 1 to determine the transitions between states of FIG. 4. It should be appreciated that the voltage levels of Table 1 are exemplary and vary depending on the charge capacity of the battery 330. Any suitable voltage levels are possible, as long as the voltage levels are analyzed during state transitions.

Figure 5A:
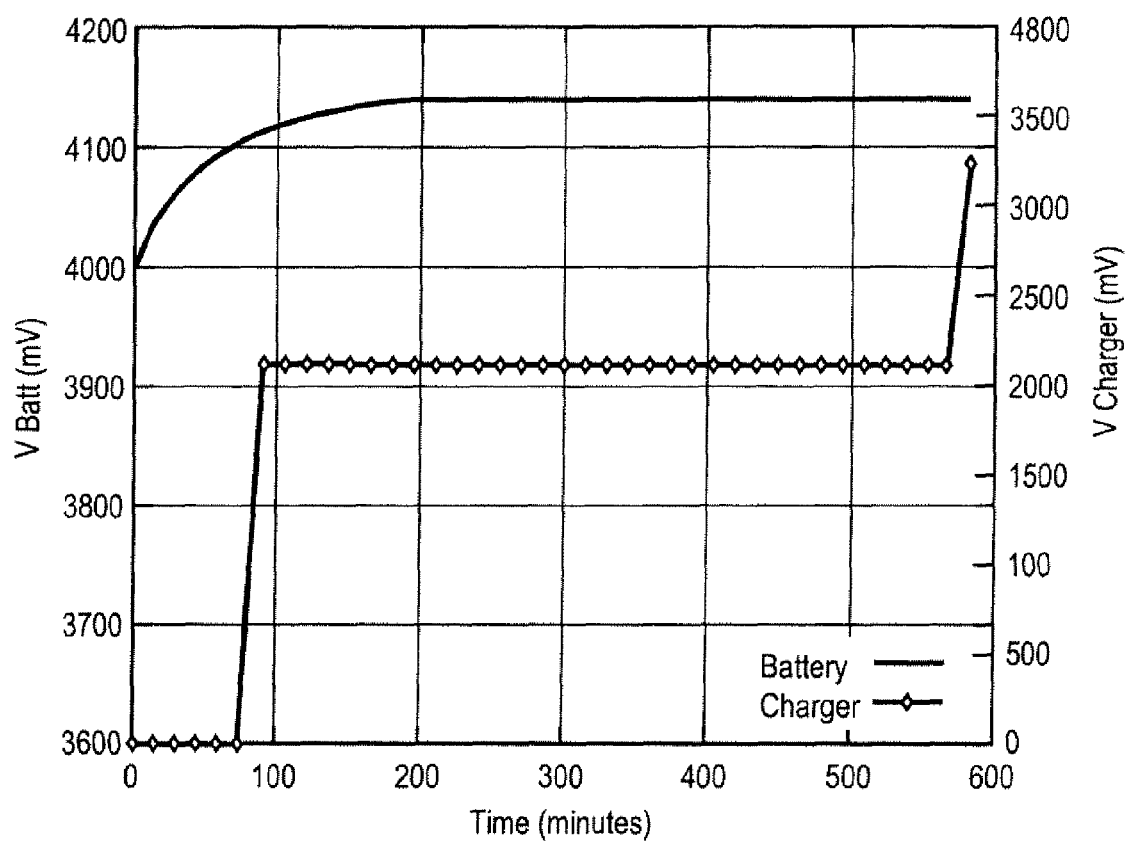
FIG. 5A is a chart illustrating the effects of charging a battery of the non-volatile memory, in accordance with an embodiment of the invention.

FIG. 5A is a chart illustrating the effects of charging the battery 330 of the non-volatile memory 110, in accordance with an embodiment of the invention. For example, the battery 330 has a voltage level sufficient to enter the normal operation and the charger on states. While the storage system 100 operates, the charger 335 is turned on and power is supplied via the voltage line to the battery 330. Voltage level values are stored in the register block 345 of the I²C controller 340 and analyzed by the operating system of the storage system 100. While the voltage levels of the charger 335 are below approximately 3000 mV, the charger 335 recharges the battery 330. After approximately 500 minutes, the voltage level of the charger 335 exceeds approximately 3000 mV and the operating system of the storage system 100 turns off the charger 335. Thereafter, a transition to the normal operation state occurs.

Figure 5B:
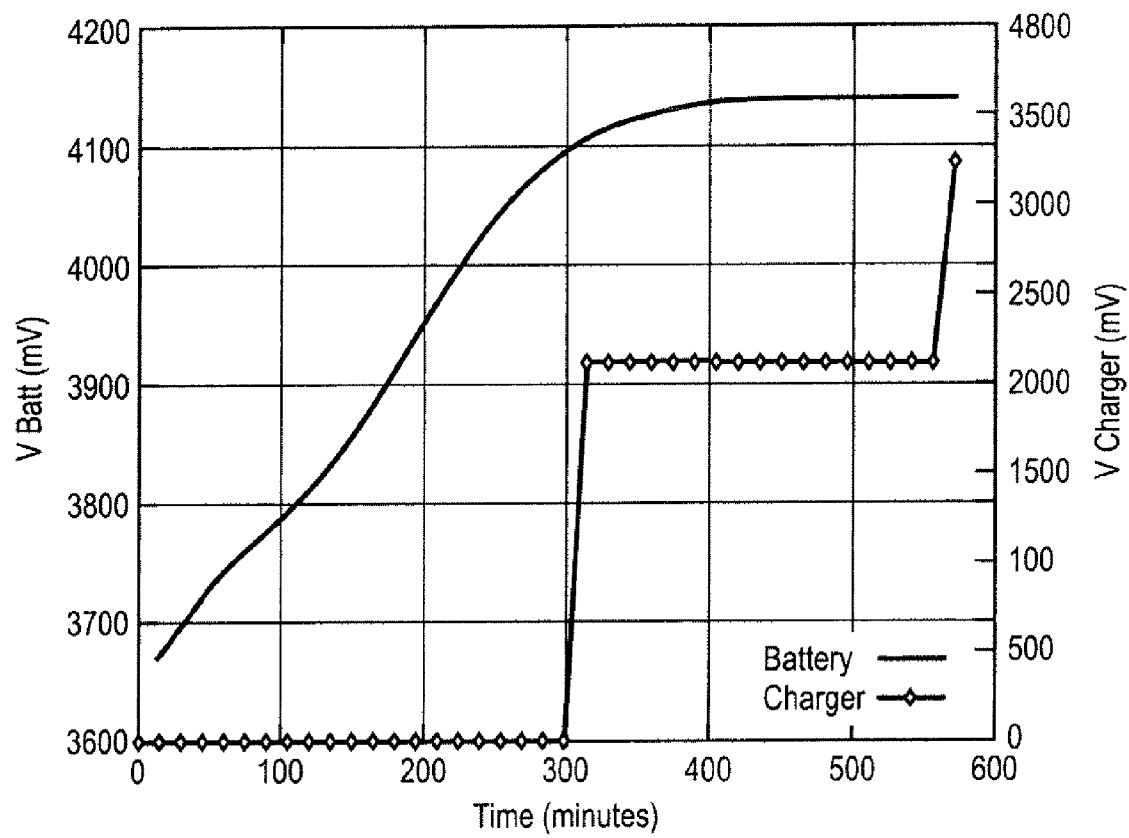
FIG. 5B is another chart illustrating the effects of charging a battery of the non-volatile memory, in accordance with an embodiment of the invention.

FIG. 5B is another chart illustrating the effects of charging the battery 330 of the non-volatile memory 110, in accordance with an embodiment of the invention. Specifically, the battery 330 is fully discharged. The charger 335 recharges the battery 330 until the voltage level of the charger 335 exceeds approximately 3000 mV. Contrasted with FIG. 5A, the charts indicate that the charger 335 is capable of being turned on and off depending on the required voltage levels to operate the non-volatile memory 110. In alternative embodiments, a timed process can turn the charger 335 on and off. For example, a process of the operating system of the storage system 100 can turn the charger 335 off after approximately 500 minutes because the battery should have a minimum voltage level to operate the non-volatile memory 110. However, any suitable method of operating the charger 335 is possible without departing from embodiments of the present invention as long as the non-volatile memory 110 operates when the storage system 100 is inoperable.

Figure 6:
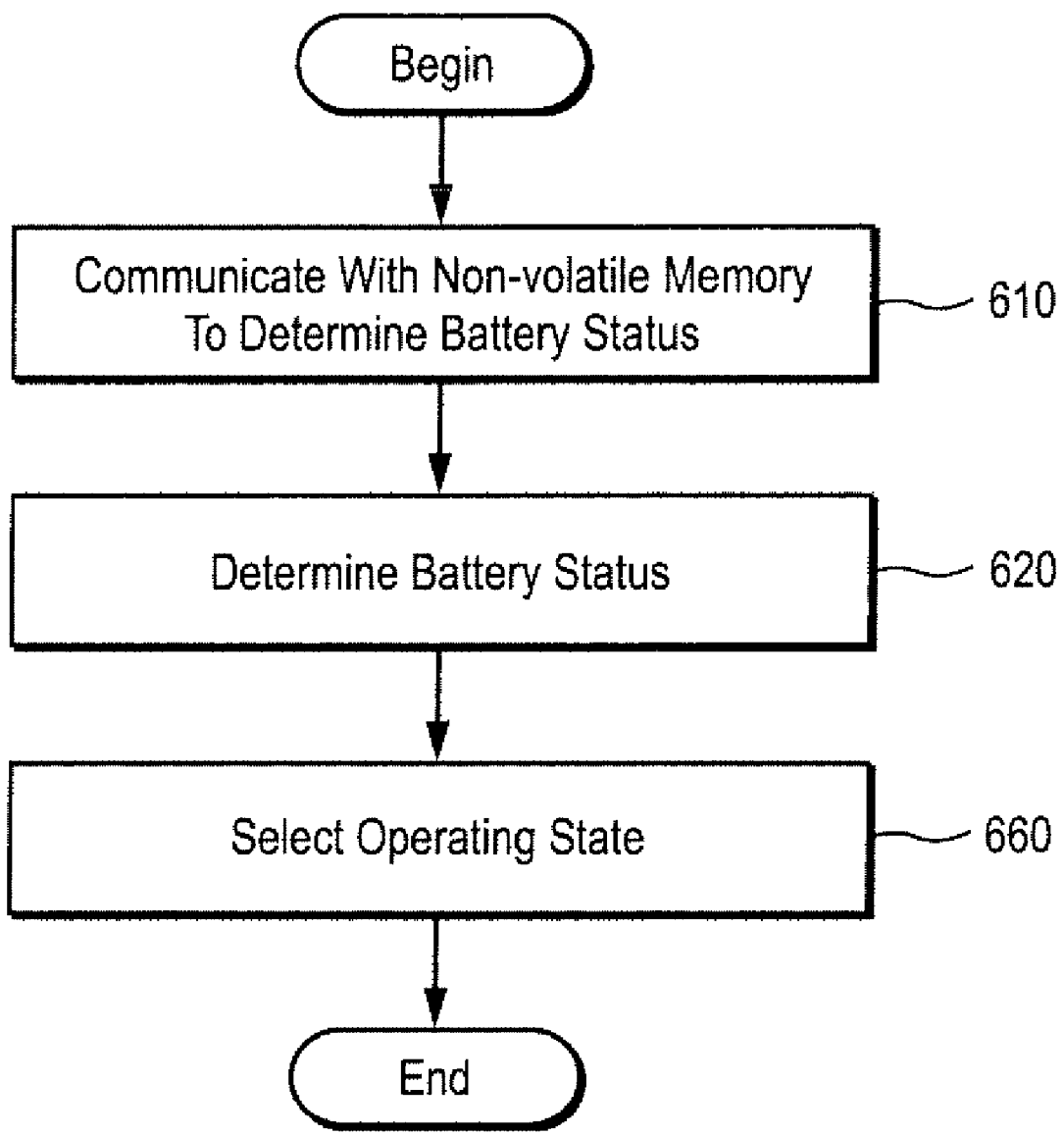
FIG. 6 is a flowchart diagram of operations for operating the non-volatile memory charger, in accordance with an embodiment of the invention.

FIG. 6 is a flowchart diagram of operations for operating the non-volatile memory charger, in accordance with an embodiment of the invention. In an exemplary embodiment, a process of an operating system communicates with non-volatile memory to determine battery status in operation 610. A battery is connected to a non-volatile memory card. The non-volatile memory card is further connected to the motherboard of the storage system. The battery supplies a minimum voltage level to the memory of the non-volatile memory card to enable data temporarily stored in memory to be maintained for at least three days of storage system inoperability. Communication between the process and the non-volatile memory card includes transmitting commands that are propagated via signals through a storage system connector of the non-volatile memory card. For example, signals that represent commands such as "turn charger on" and "turn charger off" propagate via connections to a charger and the battery.

Next, during operation 620, the process determines the battery status. Determining the battery status includes detecting the voltage levels of the battery and the charger. The voltage levels are stored in registers of the non-volatile memory card and analyzed. Thereafter, in operation 660, the process selects an operating state that is identified from multiple operating states. Exemplary operating states include a boot state, a panic state, a normal operation state, a charger on state, and a charger off state. Transitions between states occur depending on the analyzed voltage levels of the battery and the charger. For example, if the voltage level of the charger is less than approximately 3000 mV, then a signal propagated via a GPIO line is generated by the processor to transition to the charger on state, thereby replenishing the battery.

Alternatively, if the voltage level of the charger exceeds approximately 3000 mV, then another signal propagated via the GPIO line is generated by the processor to transition to the charger off state, thereby ceasing the replenishment of the battery. During the transitions between some operating states, notification messages identify whether the battery is being charged or whether the battery needs replacement. For example, while the battery is replenished, a notification message can indicate that the battery is being charged. Alternatively, the notification message can indicate that the battery needs replacement.

The operations previously described above in relation to the Figures are purely exemplary and imply no particular order. With the above embodiments in mind, it should be understood that the invention can employ various computer-implemented operations involving data stored in computer systems. These operations are those requiring physical manipulation of physical quantities. Usually, though not necessarily, these quantities take the form of electrical, magnetic, or optical signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, such as disks, which can be thereafter be read by a computer system. Examples of the computer readable medium include hard drives, network attached storage (NAS), Storage Area Network (SAN), read-only memory, random-access memory, CD-ROMs, CD-Rs, CD-RWs, magnetic tapes and other optical and non-optical data storage media. The computer readable medium can also be distributed over a network-coupled computer system so that the computer readable code is stored and executed in a distributed fashion. The computer readable medium can also be distributed using a switching fabric, such as used in Linux® compute farms.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method comprising:
    operating, by a storage system comprising an operating system, a non-volatile memory to temporarily store data, the storage system providing a client with access to data stored in a set of mass storage devices over a network, the non-volatile memory including a battery coupled to a charger, and a memory which is made non-volatile by the battery, wherein the storage system, through the operating system, analyzes a voltage level of the charger, and issue a command to operate the charger;
    detecting a voltage level of the battery to issue a command to turn on a charger that is coupled to the battery;
    issuing a command, by the storage system through the operating system, to turn the charger on to maintain a charge of the battery;
    determining a voltage level of the charger is greater than a threshold;
    issuing a command, by the storage system through the operating system, to turn the charger off in response to determining the voltage level of the charger is greater than the threshold.

2. A method as recited in claim 1, further comprising using at least three states to operate the charger.

3. A method as recited in claim 2, wherein the at least three states comprise a charger on state, a charger off state, and a normal operation state of the storage system.

4. A method as recited in claim 3, wherein the at least three states further comprise a boot state of the storage system.

5. A method as recited in claim 2, further comprising:
    detecting a voltage level of the battery,
    wherein at least one of the states is responsive to the voltage level of the battery and at least one of the states is responsive to the voltage level of the charger.

6. A method as recited in claim 1, further comprising:
    generating a notification to indicate that the battery is being charged.

7. A method as recited in claim 1, further comprising:
    generating a notification to indicate that the battery needs replacement.

8. A method as recited in claim 1, wherein operating a non-volatile memory in a storage system to temporarily store data comprises using the non-volatile memory to temporarily store data between consistency points of the storage system, each said consistency point being characterized by storing of data from temporary storage to the set of mass storage devices.

9. A method as recited in claim 1, wherein issuing the command to turn the charger on to maintain a charge of the battery comprises preventing the storage system from transitioning to a normal operation state when the battery does not have at least a predetermined voltage level.

10. A method as recited in claim 1, wherein issuing the command to turn the charger on to maintain a charge of the battery comprises:
    providing a minimum voltage level from the battery to store data and meta-data in the non-volatile memory for at least three days.

11. A method comprising:
    operating, by a storage system comprising an operating system, a non-volatile memory to temporarily store data, the storage system providing a client with access to data stored in a set of mass storage devices over a network, the non-volatile memory including a battery coupled to a charger, and a memory which is made non-volatile by the battery, wherein operating the non-volatile memory includes using the non-volatile memory to temporarily store data between consistency points of the storage system, each said consistency point being characterized by storing of data from temporary storage to a set of mass storage devices, wherein the storage system, through the operating system, analyzes a voltage level of the charger, and issues commands to operate the charger;
    using, by the storage system, at least three states to operate the charger, the at least three states including a charger on state and a charger off state, wherein at least one of the states is responsive to the voltage level of the battery and at least one of the states is responsive to the voltage level of the charger;
    detecting the voltage level of the battery to trigger a transition to the charger on state; and
    issuing a command, by the storage system through the operating system, to turn the charger on to maintain a charge of the battery;
    detecting the voltage level of the charger is greater than a threshold;
    wherein the storage system through the operating system issues a command to transition to the charger off state in response to detecting the voltage level of the charger is greater than the threshold.

12. A method as recited in claim 11, wherein the at least three states comprise a charger on state, a charger off state, and a normal operation state of the storage system.

13. A method as recited in claim 12, wherein the at least three states further comprise a boot state of the storage system.

14. A method as recited in claim 11, further comprising:
generating a notification to indicate that the battery is being charged.

15. A method as recited in claim 11, further comprising:
generating a notification to indicate that the battery needs replacement.

16. A method as recited in claim 11, wherein issuing the command by the operating system to turn the charger on comprises:
providing a minimum voltage level from the battery to store data and meta-data in the non-volatile memory for at least three days.

17. A method as recited in claim 11, wherein issuing the command by the operating system to turn the charger on comprises preventing the storage system from transitioning to a normal operation state when the battery does not have at least a predetermined voltage level.

* * * * *